United States Patent [19]

Ogita

[11] 4,342,000
[45] Jul. 27, 1982

[54] FM DETECTING CIRCUIT

[75] Inventor: Minoru Ogita, Hamamatsu, Japan

[73] Assignee: Nippon Gakki Seizo Kabushiki Kaisha, Hamamatsu, Japan

[21] Appl. No.: 135,149

[22] Filed: Mar. 28, 1980

[30] Foreign Application Priority Data

Apr. 4, 1979 [JP] Japan ............................. 54-44238[U]
Oct. 26, 1979 [JP] Japan ........................... 54-148470[U]

[51] Int. Cl.³ ........................ H03D 3/14; H03D 3/26
[52] U.S. Cl. ................................... 329/103; 329/130; 329/139; 455/214; 455/337
[58] Field of Search ........ 329/103, 129, 130, 137–143; 307/519, 510; 328/141; 455/214, 337

[56] References Cited

U.S. PATENT DOCUMENTS 2,572,424 10/1951 Amos .................................. 329/130
2,710,350 6/1955 Van Dijkum ...................... 329/130
3,130,372 4/1964 Zajac .................................. 329/130
4,225,975 9/1980 Iwamoto ........................ 455/214 X Primary Examiner—Siegfried H. Grimm
Attorney, Agent, or Firm—Cushman, Darby & Cushman

[57] ABSTRACT

In an FM detecting circuit of either the ratio detecting circuit type or the quadrature detecting circuit type arranged to have an LC resonance circuit and to detect the amount of deviation of an FM input signal relative to the resonance frequency by utilizing the resonance characteristic of the LC resonance circuit in the vicinity of the resonance frequency to thereby perform FM detection, a semiconductor element is connected to the LC resonance circuit to expand the rectilinear region of the resonance characteristic and to reduce detecting distortions.

6 Claims, 19 Drawing Figures

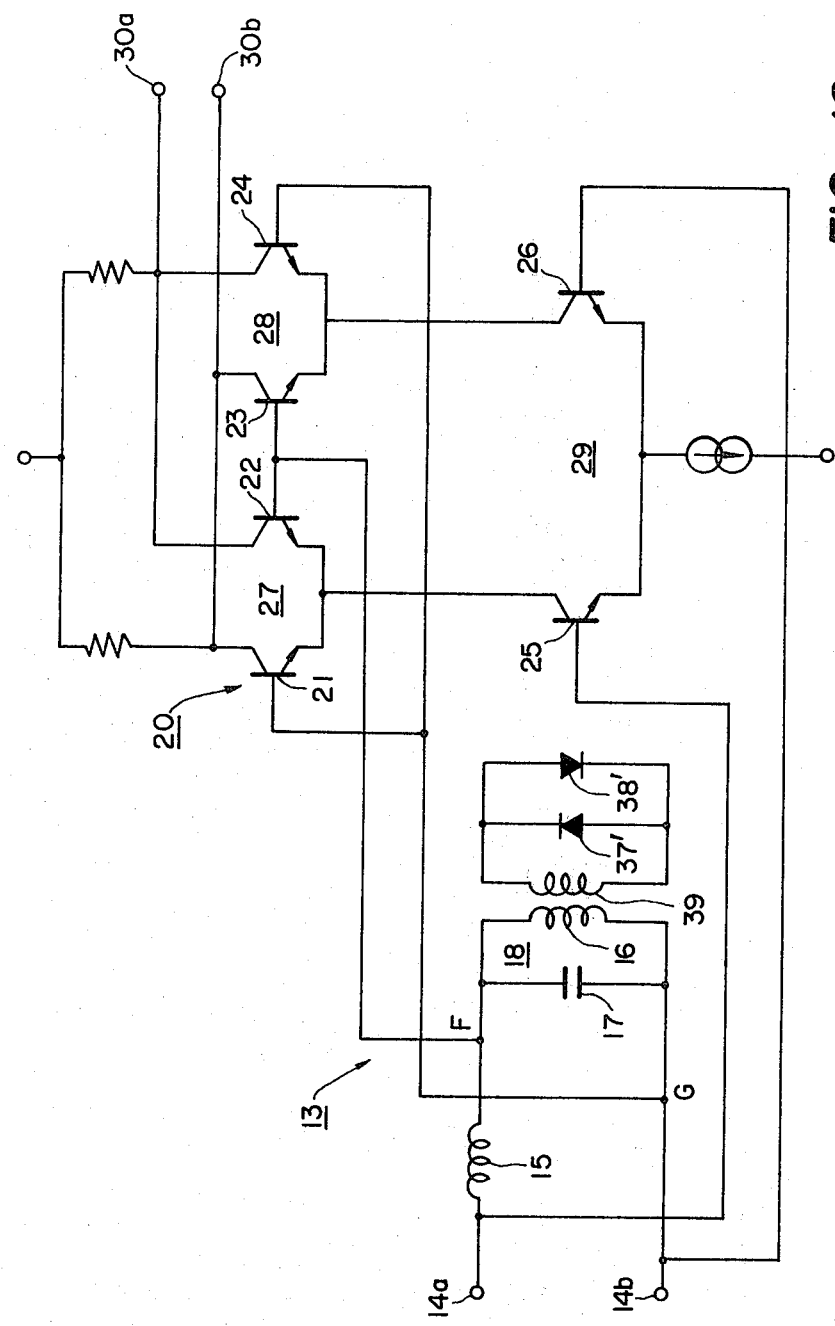

FM DETECTING CIRCUIT

BACKGROUND OF THE INVENTION (a) Field of the Invention

The present invention pertains to an FM detecting circuit, for example for use in superheterodyne FM radio receivers.

(b) Description of the Prior Art

An FM detecting circuit, for example for use in superheterodyne FM radio receivers, in general, is a circuit for deriving an audio signal from an intermediate frequency output signal having been amplified by an intermediate frequency amplifying circuit. A known such FM detecting circuit is designed to form a signal having a phase shift in proportion to a frequency deviation from a carrier frequency, and the resulting signal is converted to a voltage to obtain an FM detection output signal. Such a type of FM detecting circuit includes, for one thing, the so-called ratio detection system which uses two electromagnetically coupled tuning circuits for producing therebetween a $\pi/2$ phase difference to utilize a variation of this phase difference caused by a modulated frequency, and for another thing, the so-called quadrature detection system which is arranged to effect switching, i.e. selection, of an FM input signal having a $\pi/2$ phase-shift from said FM input signal to obtain an output, utilizing the phenomenon that said phase-shift varies in proportion to the frequency deviation.

FIG. 1 shows a basic arrangement of a known ratio detecting circuit. In FIG. 1, reference numeral 1 represents a detecting coil unit which is comprised of a primary coil 1a, a secondary coil 1b which is electromagnetically coupled to said primary coil 1a for inducing a voltage with a $\pi/2$ phase-shift relative to the phase of a voltage applied to said primary coil 1a, and a tertiary coil 1c having one terminal connected to the mid point of the secondary coil 1b for inducing a voltage with a $\pi$ phase-shift relative to the phase of a voltage applied to the primary coil 1a. A capacitor 2 is inserted between the opposite terminals of the primary coil 1a. A resonance circuit which is formed by the primary coil 1a and capacitor 2 is adapted to resonate to a carrier frequency which may, for example, be 10.7 MHz or an intermediate frequency provided by a stage in an FM radio receiver assigned for supplying an output across two input terminals 3a and 3b. Also, a capacitor 4 is connected between the opposite terminals of the secondary coil 1b. A resonance circuit which is formed by the secondary coil 1b and capacitor 4 also is adapted to resonate to said carrier frequency. On the other hand, one of the terminals of the secondary coil 1b is connected to an anode of a diode 5, and the other terminal is connected to a cathode of another diode 6. Between the cathode of the diode 5 and the anode of the diode 6 are connected capacitors 7 and 8 which are series-connected to each other and which have a same capacitance value, series-connected resistors 9 and 10 having a same resistance value, and a capacitor 11 having a large capacity. Furthermore, a connecting point C of the capacitors 7 and 8 is connected to the other terminal of the tertiary coil 1c, and also to an output terminal 12a. A connecting point of the resistors 9 and 10 is connected to another output terminal 12b and to ground.

The known ratio detecting circuit mentioned above is operative so that, when an FM input signal is applied across the input terminals 3a and 3b, there are induced a voltage $V_A$ and a voltage $V_B$ whose ratio is adapted to vary in accordance with a frequency deviation of an FM signal, across a terminal point A of the secondary coil 1b and the other terminal point C of the tertiary coil 1c, and across the other terminal point B of the secondary coil 1b and said point C, respectively, of the detection coil unit 1. These voltages $V_A$ and $V_B$ are subjected to detection by the diodes 5 and 6 so that a voltage $V_D$ is produced across the point D located on the cathode side of the diode 5 and said point C, and another voltage $V_E$ is produced across the point E located on the anode side of the diode 6 and said point C, respectively. A differential voltage between these voltages $V_D$ and $V_E$ is derived, as a detection output, across the output terminals 12a and 12b. In the above-stated detection circuit of the prior art, it should be understood that, in case the signal level of the FM input signal input across the input terminal 3a and 3b is high, there arises the tendency that the voltage, $V_D-V_E$, between the points D and E becomes higher. At such instance, however, there flows a large charge-up current for the capacitor 11, so that, as a result, said voltage $V_D-V_E$ is held constant. Also, even in case the signal level of the FM input signal becomes low and in case, accordingly, the voltage $V_D-V_E$ tends to become low, this voltage $V_D-V_E$ is held constant owing to the electric charge of the capacitor 11. Thus, this known ratio detecting circuit has in itself a voltage or signal level limiting function by the provision of the capacitor 11.

It should be understood, however, that the instance wherein said signal level limiting function operates in the ratio detecting circuit of the prior art stated above is limited to such instance where the velocity of variation of the signal level is greater than a time constant which is determined by the value of the capacitor 11 and the values of the resistors 9 and 10. In case the velocity of variation of the signal level is smaller than the time constant, there is not developed any signal level limiting function in this detecting circuit.

Also, the ratio detecting circuit of the prior art described above has another disadvantage in addition to that discussed above. When consideration is made of an output voltage characteristic, i.e. S-curve characteristic, relative to an input frequency, the rectilinear region in the S-curve characteristic is only within the range of ±150 kHz, and thus no sufficient distortion-reducing effect can be expected.

On the other hand, in the known quadrature detecting circuit, its $\pi/2$ phase-shifting circuit is, ordinarily, comprised of a coil and an LC resonance circuit whose resonance frequency is identical with the frequency of a carrier signal. This detection circuit utilizes a resonance characteristic in the vicinity of a resonance frequency of said LC resonance circuit in order to effect a $\pi/2$ phase-shifting of an FM input signal. Thus, this known quadrature detecting circuit has the disadvantage that, in case the resonance characteristic of the LC resonance circuit is not proper, i.e. in case the rectilinear region of the resonance characteristic in the vicinity of the resonance frequency is narrow, the distortion characteristic in the detected signal becomes poor. Accordingly, it is usual in this known detecting circuit to provide means of some sort as a counter-measure for the purpose of suppressing the development of the distortion at the time of detection due to said resonance characteristic.

FIG. 2 is a circuit diagram showing an example of a known quadrature detecting circuit designed so as to suppress the development of the aforesaid distortions. In FIG. 2, reference numeral 13 represents a phase-shifting circuit for effecting a $\pi/2$ phase-shift of an FM input signal applied across input terminals 14a and 14b. This phase-shifting circuit 13 is comprised of a coil 15 having an end connected to the input terminal 14a and of an LC circuit 18 inserted between the other end of said coil 15 and the input terminal 14b and formed with a coil 16 and a capacitor 17, and a resistor 19 which is connected in parallel with said LC resonance circuit 18. By arranging the resonance frequency $f_o$ of this LC resonance circuit 18 to be in agreement with the carrier frequency, there is derived a signal which represents a $\pi/2$ phase-shifted FM input signal, across the opposite terminal points F and G of the LC resonance circuit 18. Reference numeral 20 represents a multiplying circuit for effecting switching of said FM input signal by an output signal of the phase-shifting circuit 13. This multiplying circuit 20 is a double-balanced differential circuit provided with three differential amplifiers 27 to 29 which are formed by transistors 21 to 26. A product output signal of this multiplying circuit 20 is output to its output terminals 30a and 30b.

In the above-stated quadrature detecting circuit, an FM input signal which is input across the input terminals 14a and 14b is directly supplied to the multiplying circuit 20. Simultaneously, this FM input signal is supplied to this multiplying circuit 20 as a signal having been given a $\pi/2$ phase-shift by the phase-shifting circuit 13. The multiplying circuit 20 effects switching of the FM input signal with a signal representing a $\pi/2$ phase-shifted FM input frequency signal, and outputs, across the output terminals 30a and 30b, a pulse signal having a pulse width which is in proportion to a phase difference between the signal applied across the input terminals 14a and 14b and the signal across the point F and G. The signal which is derived across the output terminals 30a and 30b is rendered to an FM detection output by passing this signal across the terminals 30a and 30b through a low-pass filter not shown.

The above-stated quadrature detecting circuit is arranged so that the development of distortions at the time of detection due to the resonance characteristic of the LC resonance circuit 18 in the phase-shifting circuit 13 is suppressed by damping the quality factor Q of this LC resonance circuit 18. More specifically, the frequency characteristic versus phase in the phase-shifting circuit 13 can be varied in a manner as shown in FIG. 3 by varying the quality factor Q of the LC resonance circuit 18. By damping the quality factor Q, it is possible to expand the rectilinear region of the resonance characteristic of the LC resonance circuit 18. As described above, this known quadrature detecting circuit is designed so that the quality factor Q of the LC resonance circuit 18 is damped to expand the rectilinear region of the frequency characteristic of the phase-shifting circuit 13, to thereby suppress the development of distortions at the time of detection.

The above-described known quadrature detecting circuit, however, has the disadvantage that the detection efficiency, i.e. the ratio of output voltage deviation to input frequency deviation, becomes poor because of the arrangement that the quality factor Q of the LC resonance circuit 18 is damped by means of the resistor 19. There is a further disadvantage that, in view of the effect of expansion of the aforesaid rectilinear region of the resonance characteristic by said resistor 19 being trivial, then no sufficient distortion-reducing effect can be expected.

FIG. 4 is a circuit diagram showing another known quadrature detecting circuit designed to reduce the development of distortions at the time of detection. The quadrature detecting circuit shown therein is such that the phase-shifting circuit 13 is arranged in a double-tuning fashion. A tuning circuit 31 is constructed so that a capacitor 33a and a resistor 34a are connected in parallel to the primary coil 32a of a coil unit 32, and a capacitor 33b and a resistor 34b are connected in parallel to the secondary coil 32b of said coil unit 32. According to this known quadrature detecting circuit, it is possible to expand the rectilinear region of the frequency characteristic in the phase-shifting circuit 13 without the accompaniment by a lowering of detection efficiency, by appropriately selecting the coupling coefficient of the primary coil 32a and the secondary coil 32b, the resistance values of the resistors 34a and 34b, and the respective resonance frequencies of the respective resonance circuits formed with the primary coil 32a and the capacitor 33a, and with the secondary coil 32b and the capacitor 33b, respectively.

The above-stated quadrature detecting circuit has the disadvantage that the aforesaid selection of respective values of said constituent elements is very troublesome, and a further disadvantage that, alike the prior circuit shown in FIG. 2, the effect of expansion of the rectilinear region of the frequency characteristic of the phase is only small, so that no sufficient distortion-reducing effect can be expected.

As explained above, both of the above-described known ratio detecting circuit and quadrature detecting circuit have the disadvantages that the rectilinear region of the resonance characteristic of the resonance circuit in the vicinity of the resonance frequency is narrow, and that, accordingly, the effect of reduction of distortions is not sufficient, so that there cannot be obtained a sufficient detection characteristic for a high frequency spectrum component which is required in performing the detection of FM multiple broadcasting. Also, in the known ratio detecting circuit, the signal level limiting effect is not sufficient.

SUMMARY OF THE INVENTION

It is, therefore, a primary object of the present invention to provide an FM detecting circuit, for example for use in superheterodyne FM radio receivers, which is arranged so that the damping effect of the LC resonance circuit is intensified at the resonance frequency and is progressively mitigated as the input frequency deviates progressively from the resonance frequency.

Another object of the present invention is to provide an FM detecting circuit of the type described above, which effects a sufficient expansion of the rectilinear region of the resonance characteristic in the vicinity of the resonance frequency of the LC resonance circuit.

Still another object of the present invention is to provide an FM detecting circuit of the type described above, which provides for a sufficient distortion-reducing effect.

A further object of the present invention is to provide an FM detecting circuit of the type described above, which, in the ratio detection having a signal level limiting effect, can extend said signal level limiting effect as far as to a region close to the direct current range wherein the variation of signal level is gentle.

BRIEF DESCRIPTION OF THE DRAWINGS

FIG. 19 is a circuit diagram of still another embodiment of the quadrature detecting circuit according to the present invention.

DETAILED DESCRIPTION OF THE PREFERRED EMBODIMENTS

Figure 1:
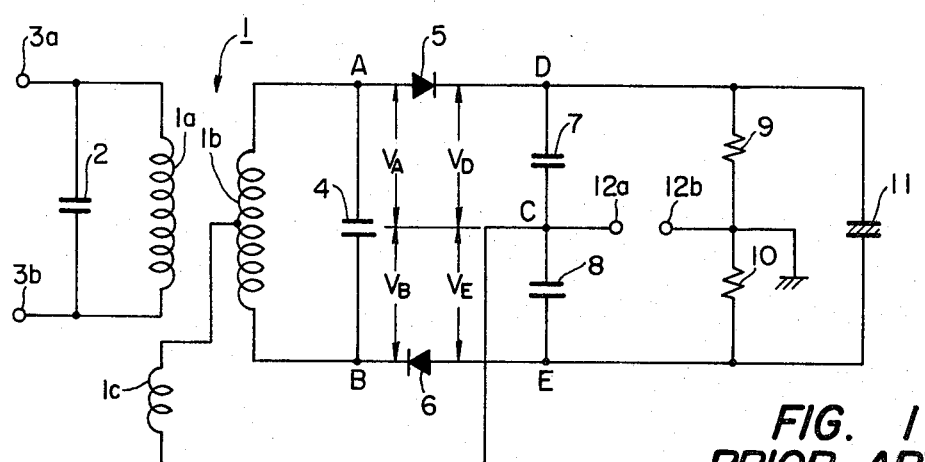
FIG. 1 is a circuit diagram of a known ratio detecting circuit.
Figure 3:
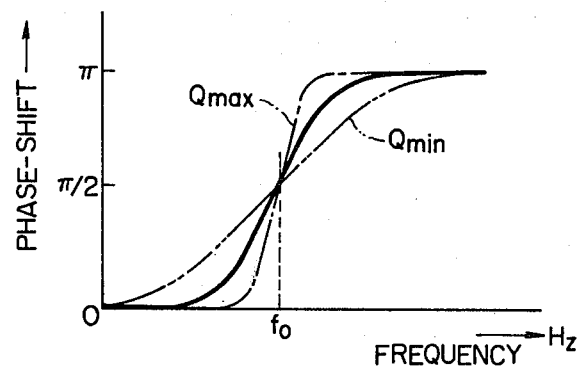
FIG. 3 is a diagram showing the frequency characteristic versus phase of the phase-shifting circuit of the quadrature detecting circuit shown in FIG. 2.
Figure 5:
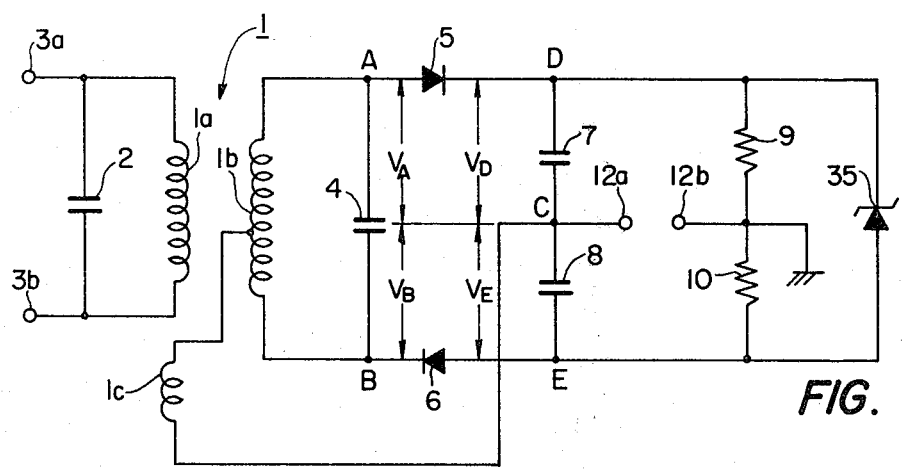
FIG. 5 is a circuit diagram showing an embodiment of a ratio detecting circuit according to the present invention.

Fig. 5 is a circuit diagram of an embodiment of the ratio detecting circuit according to the present invention. In FIG. 5, those constituent elements similar to those shown in FIG. 1 are given similar reference numerals, and their explanation is omitted. The ratio detecting circuit shown in FIG. 5 differs from the detecting circuit shown in FIG. 1 in that the capacitor 11 of the circuit of FIG. 1 is substituted by a Zener diode 35. In other words, the ratio detecting circuit shown in FIG. 5 is such that the signal level limiting element is comprised of a Zener diode 35.

Description will hereunder be made of the operation of the detecting circuit having the aforesaid arrangement. It should be understood firstly that the manner of operation that an FM input signal which is input across the input terminals 3a and 3b is detected is similar to that in the circuit shown in FIG. 1. Between points A and C and between points B and C, and between points D and C and between points E and C, there are produced voltages $V_A$, $V_B$ and voltages $V_D$, $V_E$, respectively, whose ratios vary in accordance with an FM signal, and an FM detection output signal is derived across the output terminals 12a and 12b. In this detecting circuit, it should be understood that in case the FM input signal which is applied across the input terminals 3a and 3b contains a signal level fluctuation component, the voltages $V_A-V_B$ and $V_D-V_E$ which tend to fluctuate in accordance with said signal level fluctuating component are kept constant by the Zener diode 35. More particularly, the Zener diode 35 always holds the voltage $V_A-V_B$ and the voltage $V_D-V_E$ at the Zener voltage, and thus it does not allow levelfluctuation to develop in these voltages. Thus, in the detecting circuit described above, the signal level limiting action of this circuit is provided by the Zener effect exerted by the Zener diode 35. Therefore, the signal level limiting action in such instance as this inhibits not only those ordinary signal level fluctuating components but also inhibits such signal level fluctuating components which are close to the direct current range.

On the other hand, in the detecting circuit described above, the load impedance across the points D and E is such that by varying this load impedance by utilizing the variation of the impedance of the Zener diode 35, the rectilinear region in the vicinity of the resonance frequency of the S-curve characteristic is expanded, allowing the detection of an FM signal of a wide frequency range. This aspect will hereunder be described in further detail.

Figure 6:
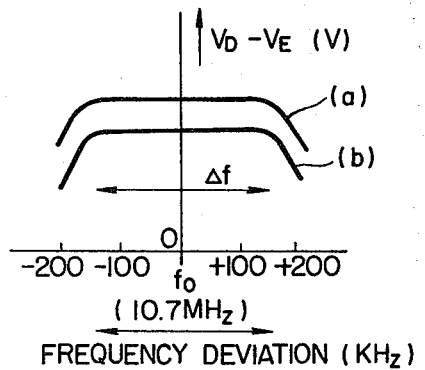
FIG. 6 is a diagram showing the frequency characteristic of the voltage $V_D-V_E$ for a large impedance (a) and for a small impedance (b) load in the known ratio detecting circuit shown in FIG. 1.
Figure 7:
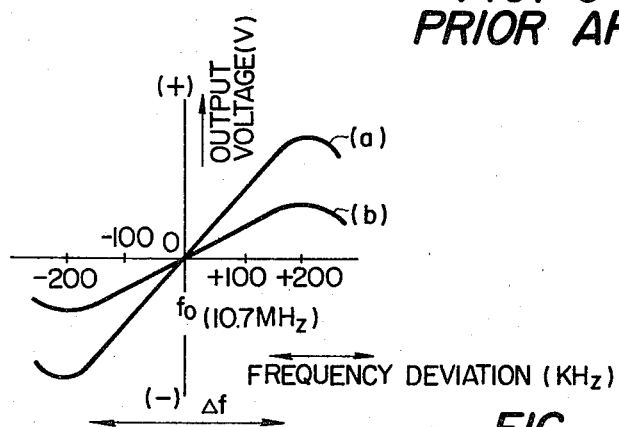
FIG. 7 is a diagram showing the S-curve characteristic for a large load impedance (a) and for a small load impedance (b) in the known ratio detection circuit shown in FIG. 1.

To begin with, in the detecting circuit shown in FIG. 5, let us consider a circuit having no Zener diode 35 connected thereto. In such an arrangement, the load impedance across the points D and E is determined mainly by the capacitors 7, 8 and the resistors 9, 10. More particularly, by setting the load impedance to a small value, i.e. by increasing the load weight, the voltage $V_D-V_E$ reduces. Conversely, when the load impedance is set to a large value, i.e. the load weight is decreased, the voltage $V_D-V_E$ will increase. This relationship is shown in FIG. 6. In this Figure, curves (a) and (b) represent a greater load impedance and a smaller load impedance, respectively. Accordingly, the output voltage which is derived across the output terminals 12a and 12b exhibits such S-curve characteristic as shown in FIG. 7. The curve (a) in FIG. 7 represents the S-curve characteristic when the load impedance is great, whereas the curve (b) indicates the S-curve characteristic when the load impedance is small. In FIGS. 6 and 7, the frequency range Δf indicates the aforesaid rectilinear region in the S-curve characteristic.

Figure 8:
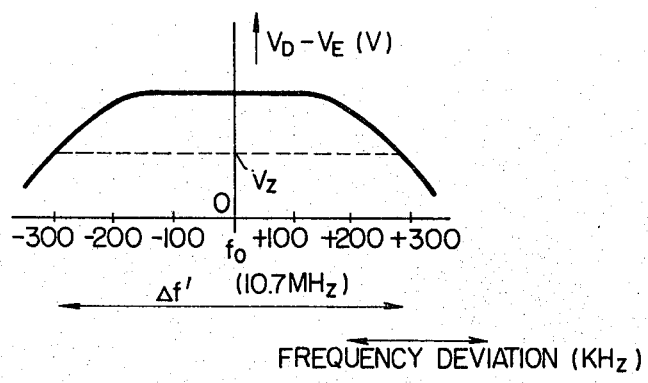
FIG. 8 is a diagram showing the frequency characteristic of the voltage $V_D-V_E$ intended for the explanation of the operation of the ratio detecting circuit of the embodiment of the present invention shown in FIG. 5.

Next, let us consider a detecting circuit of FIG. 5 wherein the Zener diode 35 is connected between the points D and E. The voltage $V_D-V_E$ across the points D and E is suppressed by the Zener voltage $V_Z$ of the Zener diode 35. More particularly, as shown by the broken line in FIG. 8 wherein the solid line represents the frequency characteristic relative to the voltage $V_D-V_E$, in the instance where no Zener diode 35 is inserted, the voltage $V_D-V_E$ drops down to the Zener voltage $V_Z$ due to the Zener effect of the Zener diode 35, in the frequency range $\Delta f'$. That is, in the region of the frequency range $\Delta f'$, a greater difference between the voltage prior to the insertion of the Zener diode 35 and the Zener voltage $V_Z$ will bring about a smaller impedance of the Zener diode 35. Accordingly, the impedance of the Zener diode 35 will become minimum in the vicinity of the resonance frequency $f_o$, and this impedance will increase as the input frequency signal deviates farther from the resonance frequency $f_o$. Therefore, the load impedance across the points D and E becomes small, i.e. meaning that the load weight is increased, in the vicinity of the resonance frequency, whereas this load impedance increases as the frequency deviates farther form the resonance frequency, i.e. meaning that the load weight is small. In this way, the Zener diode 35 acts as a load-varying element between the points D and E.

Figure 9:
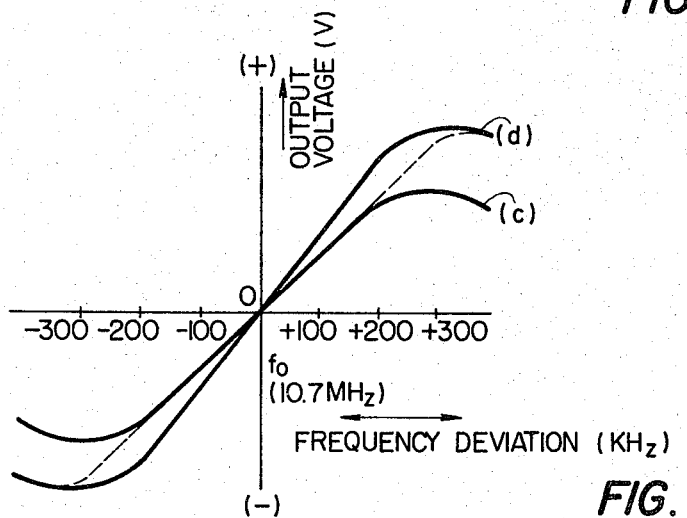
FIG. 9 is a diagram showing the S-curve characteristic for the explanation of the operation of the ratio detecting circuit representing the embodiment shown in FIG. 5.

Let us here consider the S-curve characteristic of the detecting circuit which is obtained across the output terminals 12a and 12b, by referring to FIG. 9. In this Figure, curve (c) represents the S-curve characteristic in case there is connected, between the points D and E, a certain impedance corresponding to a certain impedance determined by the Zener diode 35 in the vicinity of said resonance frequency $f_o$. Curve (d) in FIG. 9 represents the S-curve characteristic where no Zener diode 35 is connected across the points D and E. As stated previously, in the vicinity of the resonance frequency, the impedance of the Zener diode 35 becomes minimum, and is approximated to the abovementioned curve (c). Also, in a peripheral frequency, the impedance of the Zener diode 35 becomes great, and progressively will be approximated closer to said curve (d). Accordingly, the output voltage which is derived across the output terminals 12a and 12b of the ratio detecting circuit shown in FIG. 5 will exhibit such S-curve characteristic as indicated by the broken line in FIG. 9. As discussed above, the rectilinear region of the S-curve characteristic indicated by the broken line will become substantially expanded as compared with those respective independent curves as indicated by (c) or (d). Thus, it is possible to effect the detection of an FM signal over a wide frequency range, and this is extremely advantageous for performing a highly faithful demodulation of an FM signal. It should be noted here that, for said Zener diode 35, it is only necessary to use one having such Zener voltage $V_Z$ as is suitable for effecting the suppression of the voltage $V_D-V_E$ across the points D and E, as stated above.

Figure 10:
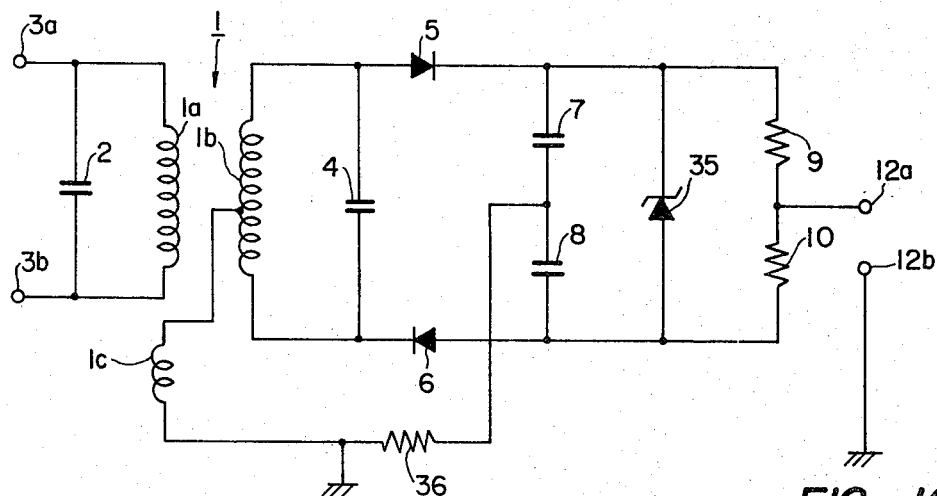
FIG. 10 is a circuit diagram showing another embodiment of the ratio detecting circuit according to the present invention.

FIG. 10 is a circuit diagram showing another embodiment of the ratio detecting circuit according to the present invention. Those constituent elements in FIG. 10 similar to those shown in FIGS. 1 and 5 are given similar reference numerals. The ratio detecting circuit shown in FIG. 10 differs from that shown in FIG. 5 in that the other end of the tertiary coil 1c in the detecting coil unit 1 is grounded, and the connecting point of the capacitors 7 and 8 is grounded via a resistor 36, so that there is obtained a detection output across the grounded output terminal 12b and the output terminal 12a which is connected to the connecting point of the resistors 9 and 10. It should be noted that this ratio detecting circuit shown in FIG. 10 is different from that shown in FIG. 5 only in the manner of deriving the detection output, and that a function similar to that obtained from the circuit shown in FIG. 5 can be obtained.

Figure 11:
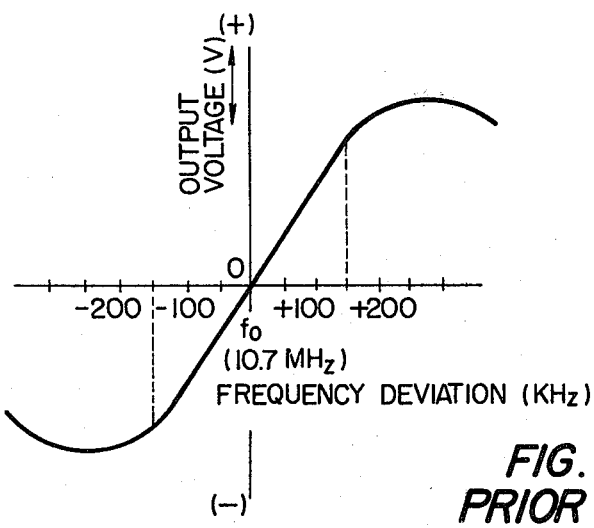
FIG. 11 is a diagram showing the S-curve characteristic of the known ratio detecting circuit shown in FIG. 1.
Figure 14:
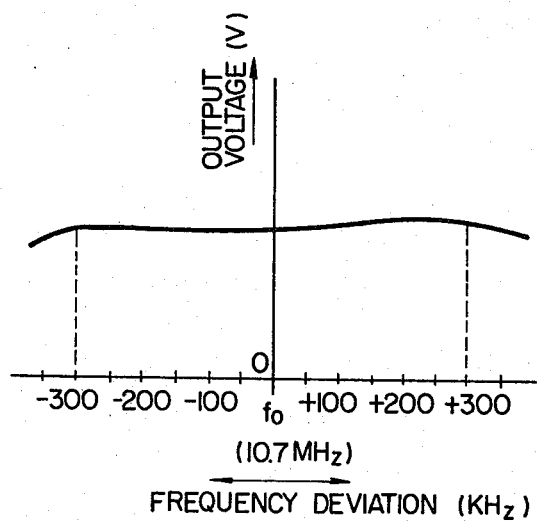
FIG. 14 is a diagram showing the differential gain characteristic of the ratio detecting circuit shown in FIG. 5 or FIG. 10.

FIGS. 11 and 14 show the result of observation of the electric characteristics of the ratio detecting circuits of the prior art shown in FIG. 1 and of the present invention shown in FIG. 5 or FIG. 10, respectively.

FIG. 11 is a diagram showing the S-curve characteristic of the known ratio detecting circuit.

Figure 12:
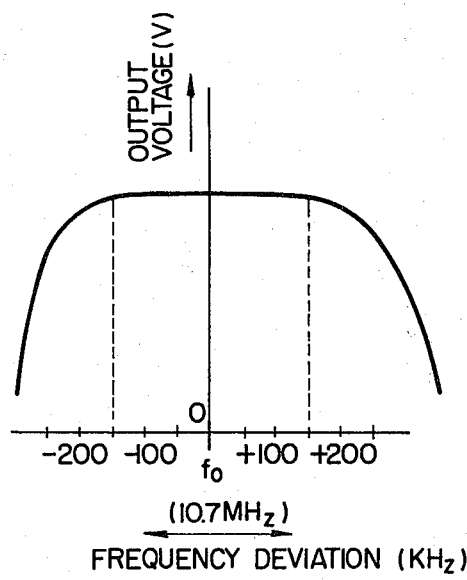
FIG. 12 is a diagram showing the differential gain characteristic of the known ratio detecting circuit shown in FIG. 1.

FIG. 12 is a diagram showing the differential gain characteristic of the known ratio detecting circuit.

Figure 13:
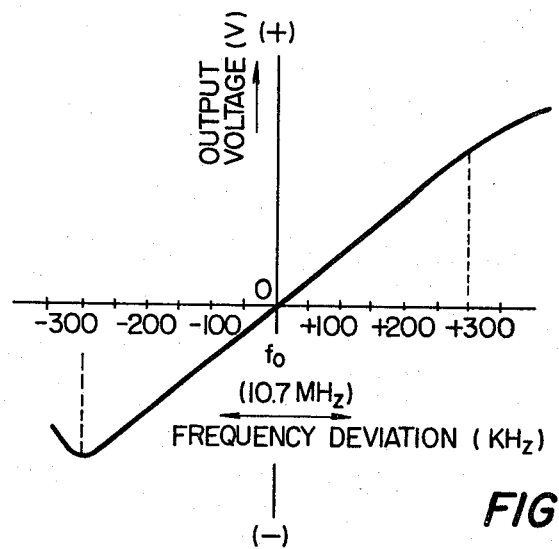
FIG. 13 is a diagram showing the S-curve characteristic of the ratio detecting circuit shown in FIG. 5 or FIG. 10.

FIG. 13 is a diagram showing the S-curve characteristic of the ratio detecting circuit according to the present invention.

FIG. 14 is a diagram showing the differential gain characteristic of the ratio detecting circuit according to the present invention.

As noted from these diagrams, in the known ratio detecting circuit, the rectilinear region of the S-curve characteristic and of the differential gain characteristic are in the order of resonance frequency $f_o$ (10.7 Mhz) $\pm 150$ kHz. In contrast thereto, in the ratio detecting circuit according to the present invention, the rectilinear region of these characteristics are noted clearly to be obtained in the order of resonance frequency $f_o \pm 300$ kHz or greater.

Figure 15:
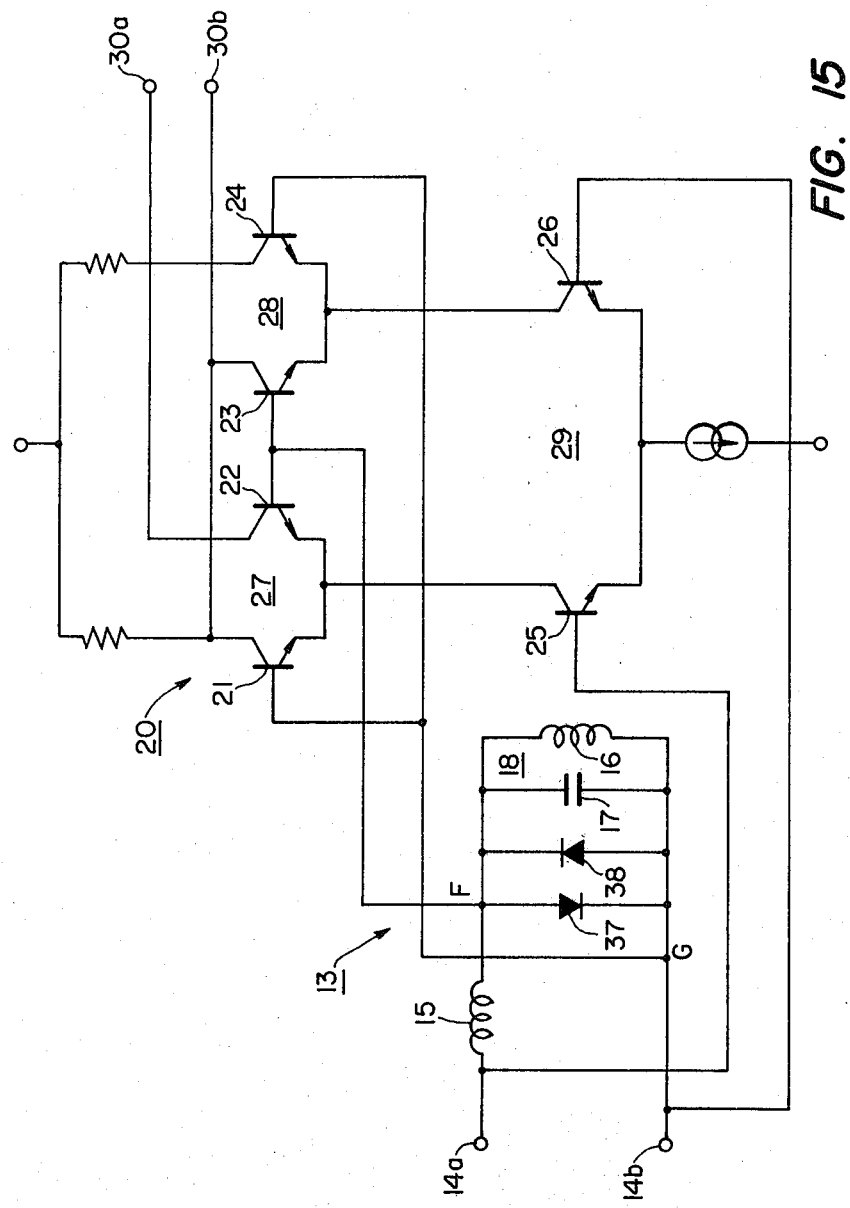
FIG. 15 is a circuit diagram showing the quadrature detecting circuit according to an embodiment of the present invention.

FIG. 15 is a circuit diagram of an embodiment of the quadrature detecting circuit according to the present invention. In FIG. 15, those constituent elements similar to those of the known quadrature detecting circuit shown in FIG. 2 are given similar reference numerals to omit their explanation.

Figure 2:
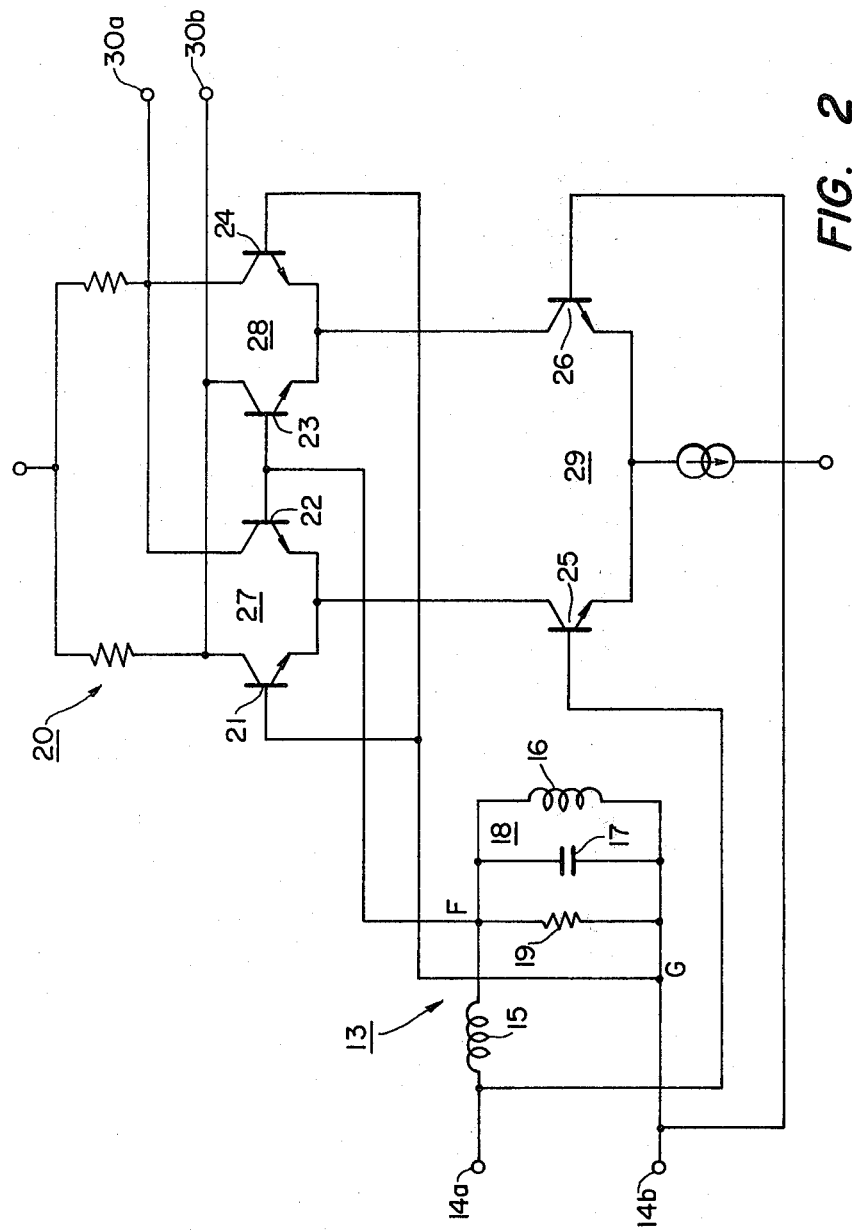
FIG. 2 is a circuit diagram of a known quadrature detecting circuit.
Figure 4:
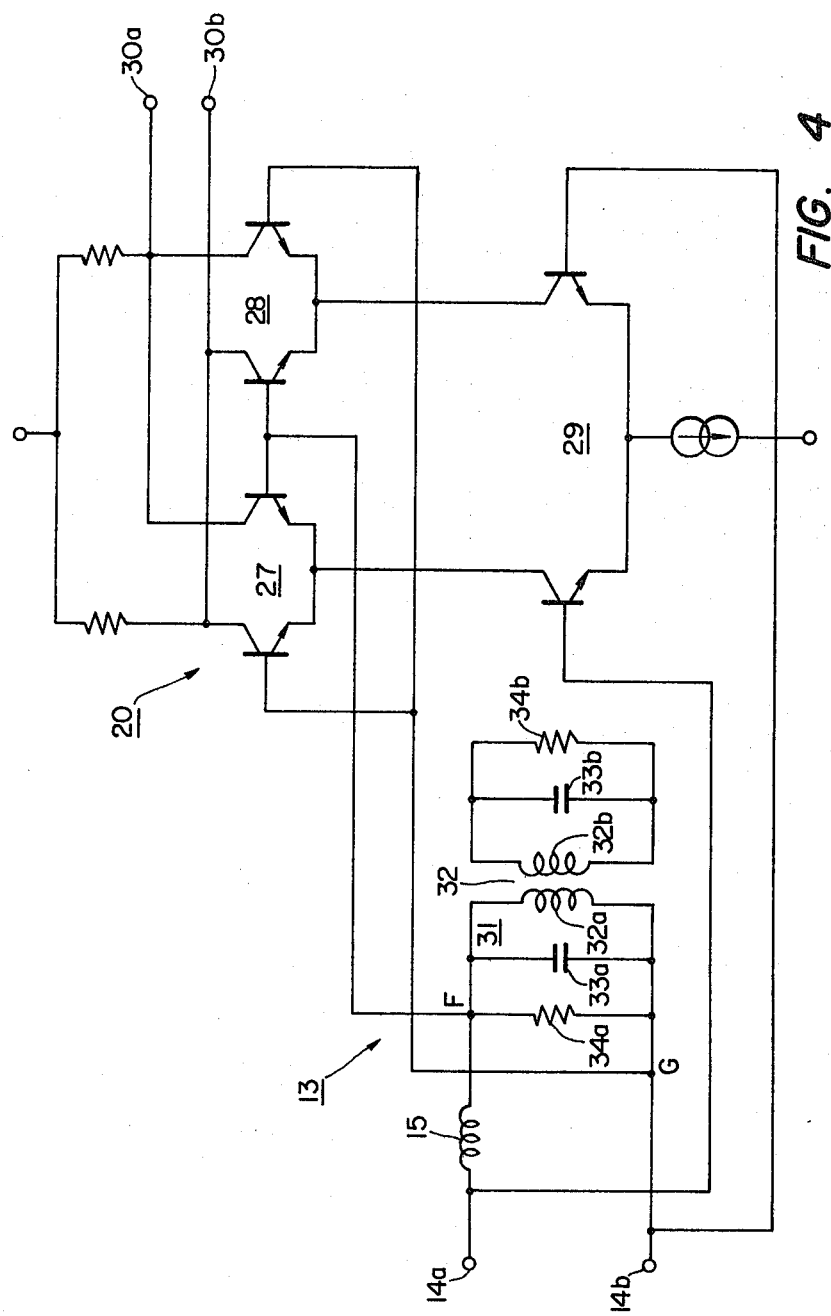
FIG. 4 is a circuit diagram showing another known quadrature detecting circuit.

This quadrature detecting circuit differs from the known such circuit shown in FIG. 2 in that the resistor 19 in the phase-shifting circuit 13 of the circuit shown in FIG. 2 is replaced by diodes 37 and 38 which are connected in parallel. More particularly, the quadrature detecting circuit of this embodiment is constructed so that the diodes 37 and 38 are employed to serve as the damping elements for the LC resonance circuit 18 of the phase-shifting circuit 13 which is assigned to effect $\pi/2$ phase-shifting of the FM input signal.

Figure 16:
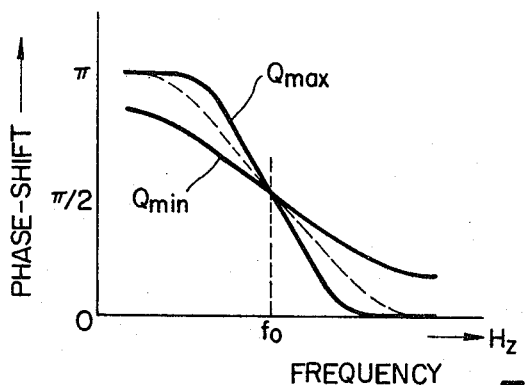
FIG. 16 is a diagram showing the frequency characteristic versus the phase for the explanation of the operation of the phase-shifting circuit of the quadrature detecting circuit shown in FIG. 15.
Figure 17:
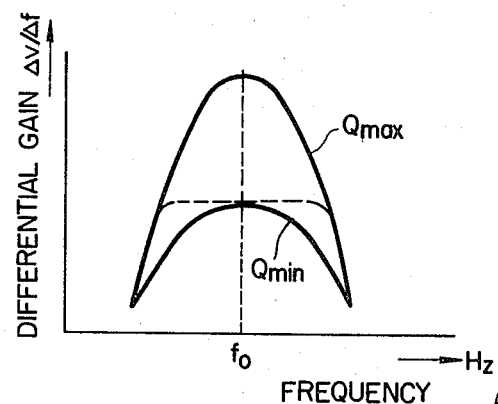
FIG. 17 is a diagram showing the differential gain characteristic for the explanation of the operation of the phase-shifting circuit of the quadrature detecting circuit shown in FIG. 15.
Figure 18:
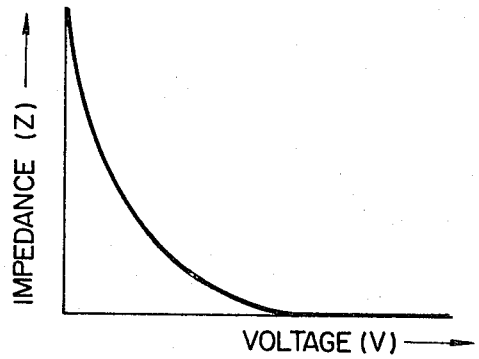
FIG. 18 is a diagram showing the impedance characteristic relative to the applied voltage in an ordinary diode.

In the quadrature detecting circuit of this embodiment, the frequency characteristic versus the phase shift by the phase-shifting circuit 13 varies in a manner as illustrated in FIG. 16 in accordance with the quality factor Q of the LC resonance circuit 18, whereas the differential gain characteristic of the circuit varies in a manner as shown in FIG. 17 in accordance with the quality factor Q. The quality factor Q of the LC resonance circuit 18 is determined by the impedances of the diodes 37 and 38 which are connected, in opposite directions relative to each other, and in parallel to the LC resonance circuit 18. Now, the impedance characteristic of an ordinary diode relative to the voltage (applied voltage) is as shown in FIG. 18, which illustrates that the impedance decreases with an increase in the applied voltage. Accordingly, the impedances of the diodes 37 and 38 in FIG. 15 will become minimum at the resonance frequency $f_o$ (carrier frequency) of the LC resonance circuit 18, and will increase as the frequency departs farther from this resonance frequency $f_o$. The damping action which is given the LC resonance circuit 18 by these diodes 37 and 38, i.e. the action to lower the quality factor Q of the LC resonance circuit 18, will become maximum when the frequency of the signal derived across the points F and G is at the resonance frequency $f_o$, and will become smaller as the frequency of this signal departs farther from the resonance of frequency $f_o$. As a result, the frequency characteristic versus the phase and the differential gain characteristic of the phase-shifting circuit 13 will become those characteristics corresponding to the damping actions of the diodes 37 and 38, i.e. the characteristic shown by the broken line in FIGS. 16 and 17 which represents that the quality factor Q of the LC resonance circuit 18 is selected on the basis of the frequency of an input signal. Thus, in the quadrature detecting circuit of this embodiment, it is possible to considerably expand the rectilinear region of both the frequency characteristic versus the phase and the differential gain characteristic in the phase-shifting circuit 13, as shown in FIGS. 16 and 17. Thus, it is possible to effect a reduction of distortions at the time of detection. It should be understood that, in this embodiment, the damping action by these diodes 37 and 38 varies in accordance with the frequency of the input signal, so that a drop of detection efficiency will not cause any problem in practice.

FIG. 19 is a circuit diagram showing another embodiment of the quadrature detecting circuit according to the present invention. The only difference of this embodiment from that shown in FIG. 15 is that in place of the diodes 37 and 38 which are connected in parallel to the LC resonance circuit 18, there is provided a secondary coil 39 which is electromagnetically coupled to a coil 16, and two diodes 37' and 38' are connected across the opposite ends of this secondary coil 39. According to this embodiment, there is the advantage that functions similar to those obtained from the quadrature detecting circuit shown in FIG. 15 are obtained. Moreover, there is a further advantage that the diodes 37' and 38' are not limited to germanium diodes, but various kinds of diodes such as silicon diodes can be employed.

What is claimed is:

1. An FM quadrature detecting circuit comprising:
   phase-shifting means comprised of a series connection of a coil and an LC resonance circuit for effecting a $\pi/2$ phase-shift of an FM input signal, said LC resonance circuit being arranged so that its resonance frequency is tuned to a carrier frequency of said FM input signal and being operative so that a resonance characteristic of said LC resonance circuit in the vicinity of said resonance frequency is utilized to deviate a phase of said FM input signal in proportion to a deviation of frequency of said FM input signal relative to said resonance frequency,
   multiplying means for switching said FM input signal by the output from said phase-shifting means, said multiplying means producing an output signal wherein the deviation of phase is converted to a variation in said output signal, to be used as an FM detection output, and
   a damping element connected to said LC resonance circuit so as to provide an intensive damping action for said LC circuit at said resonance frequency, and to provide a lesser damping action as the frequency of said input signal deviates farther from said resonance frequency.

2. An FM detecting circuit according to claim 1, in which:
   said damping element is an element whose internal resistance varies by a voltage applied thereto.

3. An FM detecting circuit according to claim 1, in which:
   said LC resonance circuit is a parallel resonance circuit.

4. An FM detecting circuit according to claim 1, in which:
   said damping element is comprised of a parallel connection of oppositely directed diodes connected in parallel to the LC resonance circuit.

5. An FM detecting circuit according to claim 1, in which:
   the coil of said LC resonance circuit is electromagnetically coupled to another coil to which is connected a parallel connection of oppositely directed diodes serving as damping elements.

6. An FM detecting circuit according to any one of claims 1, 2, 3, 4 or 5 wherein the output signal includes a pulse signal having a pulse width responsive to the phase difference.

* * * * *